United States Patent
Maciejewski et al.

(10) Patent No.: US 10,481,223 B2
(45) Date of Patent: Nov. 19, 2019

(54) SYSTEM WITH A SUBASSEMBLY AND A HOUSING SURROUNDING THE SUBASSEMBLY

(71) Applicant: Siemens Healthcare GmbH, Erlangen (DE)

(72) Inventors: Bernd Maciejewski, Markt Erlbach (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 420 days.

(21) Appl. No.: 15/271,764

(22) Filed: Sep. 21, 2016

(65) Prior Publication Data

US 2017/0082704 A1 Mar. 23, 2017

(30) Foreign Application Priority Data

Sep. 21, 2015 (DE) .................. 10 2015 218 104

(51) Int. Cl.
| | |
|---|---|
| *G01R 33/34* | (2006.01) |
| *F16B 21/10* | (2006.01) |
| *G01R 1/04* | (2006.01) |
| *G01R 33/38* | (2006.01) |

(52) U.S. Cl.
CPC .............. *G01R 33/34* (2013.01); *F16B 21/10* (2013.01); *G01R 1/04* (2013.01); *G01R 33/3802* (2013.01)

(58) Field of Classification Search
CPC ................ G01R 33/34; G01R 33/3802; G01R 33/3858; G01R 1/04
See application file for complete search history.

(56) References Cited

U.S. PATENT DOCUMENTS

| | | | | |
|---|---|---|---|---|
| 1,397,453 A | * | 11/1921 | Rekar ................ | A61N 5/06 248/124.2 |
| 3,046,006 A | * | 7/1962 | Kulicke, Jr. .......... | B23Q 1/262 248/913 |
| 3,124,018 A | * | 3/1964 | Gough ................. | B23Q 1/621 108/20 |
| 3,525,140 A | * | 8/1970 | Cachon ................ | B23Q 1/58 248/913 |
| 3,827,686 A | * | 8/1974 | Storkh ............... | B23Q 16/001 248/286.1 |
| 4,020,742 A | * | 5/1977 | Raymond ............ | B23Q 16/001 269/71 |
| 4,138,082 A | * | 2/1979 | Fatemi ............... | B23Q 1/621 248/419 |
| 4,226,392 A | * | 10/1980 | Healy ................. | F16M 11/043 248/176.3 |
| 4,317,560 A | * | 3/1982 | Troyer .............. | B23K 37/0452 266/48 |
| 4,344,314 A | * | 8/1982 | Aldrich ............. | B21D 1/14 72/461 |

(Continued)

*Primary Examiner* — Matthieu F Setliff (74) *Attorney, Agent, or Firm* — Schiff Hardin LLP (57) ABSTRACT

In a system with a subassembly and a housing surrounding the subassembly, wherein the housing has at least one housing shell and at least one fastening component that has a receiving component that receives a fastening element of the at least one housing shell, and has an adjustment component. The receiving component is arranged on the fastening component so that it can be moved in three different spatial directions by the adjustment component.

21 Claims, 6 Drawing Sheets

(56) References Cited

U.S. PATENT DOCUMENTS

| | | | | |
|---|---|---|---|---|
| 4,442,608 A * | 4/1984 | Clausen | G01B 5/207 | 33/288 |
| 4,502,457 A * | 3/1985 | Marron | B23Q 1/5412 | 125/11.14 |
| 4,557,127 A * | 12/1985 | Pietrelli | B21D 1/145 | 72/31.02 |
| 4,613,105 A * | 9/1986 | Genequand | G02B 6/4226 | 248/178.1 |
| 4,705,252 A * | 11/1987 | Goers | G02B 7/004 | 248/187.1 |
| 4,822,014 A * | 4/1989 | Buchler | B23Q 1/621 | 269/309 |
| 5,004,205 A * | 4/1991 | Brown | G02B 7/1825 | 248/476 |
| 5,019,129 A * | 5/1991 | Johanson | B23H 11/003 | 269/136 |
| 5,026,033 A * | 6/1991 | Roxy | B23Q 3/103 | 269/309 |
| 5,547,330 A * | 8/1996 | Walimaa | F16M 11/043 | 269/71 |
| 5,716,043 A * | 2/1998 | Iwata | B23Q 1/28 | 269/73 |
| 5,735,513 A * | 4/1998 | Toffolon | B25B 1/08 | 269/138 |
| 5,895,184 A * | 4/1999 | Walters | B23Q 16/001 | 269/315 |
| 5,904,346 A * | 5/1999 | Witte | B23Q 1/626 | 269/71 |
| 6,027,085 A * | 2/2000 | Ruther | F16M 11/041 | 248/187.1 |
| 6,160,399 A * | 12/2000 | Radziun | G01R 33/385 | 324/319 |
| 6,364,302 B2 * | 4/2002 | Ausilio | B25B 5/006 | 269/238 |
| 6,439,561 B1 * | 8/2002 | Ausilio | B23Q 3/103 | 269/238 |
| 6,978,989 B2 * | 12/2005 | Glaser | B25B 5/006 | 269/3 |
| 7,100,257 B2 * | 9/2006 | Wisecarver | G02B 7/023 | 100/230 |
| 7,816,919 B2 * | 10/2010 | Yamashita | G01R 33/385 | 324/318 |
| 8,608,400 B2 * | 12/2013 | Hong | G02B 7/00 | 248/574 |
| 9,766,306 B2 * | 9/2017 | Distler | G01R 33/3802 | |
| 10,126,388 B2 * | 11/2018 | Watanabe | G01R 33/3854 | |
| 2009/0079430 A1 | 3/2009 | Yamashita | | |
| 2009/0178255 A1 * | 7/2009 | Maciejewski | B60R 13/04 | 24/697.1 |
| 2014/0197838 A1 | 7/2014 | Distler et al. | | |
| 2015/0338481 A1 * | 11/2015 | Watanabe | G01R 33/3854 | 324/322 |

* cited by examiner

SYSTEM WITH A SUBASSEMBLY AND A HOUSING SURROUNDING THE SUBASSEMBLY

BACKGROUND OF THE INVENTION

Field of the Invention

The present invention relates to a system with a subassembly and a housing surrounding the subassembly, wherein the housing has at least one housing shell and at least one fastening structure.

Description of the Prior Art

In a housing of a system, especially for large systems having a number of sub-components, tolerances of the sub-components of the system and/or tolerances of the individual housing shells of the housing must be taken into account for an arrangement and/or fastening of the housing, especially the individual housing shells of the housing. If such a system is a medical imaging system for example, especially a magnetic resonance system, the housing must be arranged in some cases decoupled from vibrations that occur during operation of the medical imaging system, especially a magnetic resonance system, in order to suppress transmission of such vibrations and/or of sound waves to a patient and/or to an operator.

SUMMARY OF THE INVENTION

An object of the present invention is to provide housing cladding for a subassembly that can compensate for tolerances of the subassembly when the housing cladding is attached to the subassembly.

The starting point for the invention is a system with a subassembly and a housing surrounding the subassembly, wherein the housing has at least one housing shell and at least one fastening structure.

In accordance with the invention, the at least one fastening structure has a receiving component, which is provided for receiving a fastening element of the at least one housing shell, and an adjustment component. The receiving component is situated by the adjustment component on the fastening structure so that the receiving component is able to be moved in three different spatial directions.

In this context a fastening structure is to be understood as a structure that is designed for fastening the at least one housing shell to the subassembly. The fastening element of the at least one housing shell is designed corresponding to the receiving component, so that a connection and/or a fastening can be established between the receiving component and the fastening element of the at least one housing shell.

Furthermore an adjustment component is to be understood as a component that is designed so that the position of the receiving component in relation to the subassembly is able to be set and/or adjusted in three different spatial directions. The three different spatial directions are preferably oriented at right angles to one another. In particular the three different spatial directions are orthogonal, so a first of the three different spatial directions is orthogonal to each of the other two of the three different spatial directions.

The inventive fastening structure achieves a compensation for tolerances, especially for production tolerances, of individual components of the subassembly for a fastening and/or arrangement of the at least one housing shell on the subassembly by the fastening structure. Furthermore the inventive fastening structure achieves a compensation for tolerances, especially for production tolerances and/or for installation tolerances, of individual components of the at least one housing shell for a fastening and/or arrangement of the at least one housing shell on the subassembly by means of the fastening structure. Preferably the receiving component is arranged movably on the fastening structure, in order to compensate for tolerances of the subassembly when the at least one housing shell is fastened to the subassembly.

In accordance with the invention, the at least one fastening structure has a base plate that is fixed to the subassembly. Preferably the base plate is fixed to a side of the subassembly facing toward the installed housing shell. This produces a secure and exact arrangement and/or positioning of the fastening structure on the subassembly. The arrangement and/or positioning of the base plate on the subassembly means that there can be a definition of the three different spatial directions for positioning the receiving component on the adjustment component. The base plate can be glued to the subassembly and/or connected by a latching connection to the subassembly and/or arranged on the subassembly by further modes of fastening that appear reasonable to those skilled in the art. In a preferred embodiment of the subassembly as magnet unit of a magnetic resonance apparatus, the base plate is welded to the magnet unit.

In a further embodiment of the invention, the adjustment component includes a first adjustment element with a web and the base plate has a slot therein, with a position of the web being adjustable in the direction of the longitudinal extent of the slot. This allows a simple positioning and/or adjustment of a position in the direction of the longitudinal extent of the slot. The first adjustment element can additionally be positioned and/or arranged in a torsion-proof manner in relation to the base plate. Preferably the direction of the longitudinal extent of the slot is a first of the three different spatial directions. The slot can form a guidance of the web for movement of the first adjustment element in the direction of the longitudinal extent of the slot. Preferably the movement of the first adjustment element is made in parallel to a primary extent surface of the base plate. The first adjustment element is preferably formed in the shape of a plate. The primary extent surface of the first adjustment element can in this case be aligned parallel to the primary extent surface of the base plate. The web of the first adjustment element extends away from the first adjustment element essentially at right angles to the primary extent surface of the first adjustment element embodied in the shape of a plate.

The adjustment component can have a first fastening element that fastens the first adjustment element to the base plate. This enables the first adjustment element to be fastened to the base plate in an exact position in relation to the base plate. The first fastening element can be formed by any fastening element that appears reasonable to those skilled in the art. Especially advantageously, however, the first fastening element is formed by a fastening screw, by which the first adjustment element can be screwed to the base plate. The first fastening element can be embodied as a self-locking fastening screw, so that an undesired loosening of the fastening screw can be prevented.

In a further embodiment of the invention, the adjustment component has a second adjustment element and a second fastening element, wherein a position of the second adjustment element is able to be set by the second fastening element. This allows positioning and/or adjustment of the fastening position for the fastening and/or arrangement of the at least one housing shell on the subassembly by the fastening component. This can be achieved especially advantageously when the position of the second adjustment element is able to be set in a direction of the longitudinal extent of the second fastening element, with the direction of the longitudinal extent of the second fastening element being aligned at right angles to the direction of the longitudinal extent of the slot of the base plate. Preferably the direction of the longitudinal extent of the second fastening element is a second of the three different spatial directions.

The second adjustment element is preferably in the shape of a plate. In addition the primary extent surface of the second adjustment element can be essentially parallel to the primary extent surface of the first adjustment element and/or parallel to the primary extent surface of the base plate. The second fastening element can be formed by any fastening element appearing reasonable to those skilled in the art. Especially advantageously, however, the second fastening element is formed as an adjustment screw, by which the position of the second adjustment element in relation to the first adjustment element and/or in relation to the base plate can be set. The second fastening element can be a self-locking screw, especially a self-locking adjustment screw, so that an undesired loosening of the adjustment can be prevented.

In a further embodiment of the invention, the first adjustment element forms a guide and the second fastening element is arranged movably in the guide of the first adjustment element. This achieves a simple positioning of the second adjustment element relative to the first adjustment element. The position of the first adjustment element, decoupled and/or independent of movement of the second adjustment element, can be maintained by the second fastening element. The guide of the first adjustment element is preferably designed corresponding to the second fastening element. For example the guide of the first adjustment element can be formed as a cylindrical recess with an internal thread, if the second fastening element is formed by an adjustment screw, for example. Preferably the second adjustment element likewise has a guide, within which the second fastening element is supported and/or arranged, and preferably the second fastening element is arranged in the direction of the longitudinal extent of the second fastening element immovably within the guide of the second adjustment element.

The adjustment unit can have a third adjustment element, on which the receiving component is arranged. This makes it possible to set the position of the receiving component in three different directions independently of one another. Each of the three adjustment elements of the adjustment component is preferably designed so as to set a position in a single direction. Preferably the third adjustment element is formed in the shape of a plate. In addition, the primary extent surface of the third adjustment element can be arranged parallel to the second adjustment element, especially to the primary extent surface of the second adjustment element, and/or parallel to the first adjustment element, especially to the primary extent surface of the first adjustment element, and/or parallel to the base plate, especially to the primary extent surface of the base plate.

In a further embodiment of the invention, the third adjustment element has at least one guide rail, which is fixed to the third adjustment element, and at least one guide element corresponding to the at least one guide rail, which is arranged movably in relation to the guide rail and/or the third adjustment element. With the third adjustment element, especially the at least one guide rail and the at least one guide element, an especially simple change of position for the receiving component in the direction of a preferred direction, especially of a direction of the longitudinal extent of the at least one guide rail and/or of the at least one guide element, can be achieved. The preferred direction and/or the longitudinal extent of the at least one guide rail and/or of the at least one guide element is preferably aligned and/or arranged parallel to a surface normal of the primary extent surface of the base plate and/or preferably parallel to a surface normal of the primary extent surface of the first adjustment element and/or preferably parallel to a surface normal of the primary extent surface of the second adjustment element and/or preferably parallel to a surface normal of the primary extent surface of the third adjustment element.

Preferably the at least one guide rail has a longitudinal extent that is parallel to the longitudinal extent of the at least one guide element. The direction of the longitudinal extent of the at least one guide element and/or of the at least one guide rail corresponds in this case to the preferred direction of the change of position of the receiving component by the third adjustment element. Preferably the direction of the longitudinal extent of the at least one guide rail and/or of the at least one guide element is the third of the three different spatial directions. Preferably there is a relative movement between the at least one guide rail and the at least one guide element in the direction of the longitudinal extent of the at least one guide rail and/or of the at least one guide element and/or in the direction of the preferred direction. Here the at least one guide element, designed correspondingly to the at least one guide rail, slides in the direction of the longitudinal extent of the at least one guide rail and/or of the at least one guide element. Preferably the receiving component is arranged on the at least one guide element corresponding to the at least one guide rail, so that an advantageous and direct positioning of the receiving component in the direction of the longitudinal extent of the at least one guide rail and/or of the at least one guide element can be achieved. In this context, a corresponding guide element is to be understood as a guide element that is designed to carry out a directed sliding movement, especially in the direction of the preferred direction, together with the guide rail and/or on the guide rail.

In accordance with the invention, the at least one guide rail and/or the at least one guide element has a longitudinal extent that is aligned at right angles to the direction of the longitudinal extent of the slot of the base plate and/or at right angles to the direction of the longitudinal extent of the second fastening element. With the three adjustment elements of the adjustment unit, the receiving component is enabled to be positioned in three different directions, and the positioning in one of the three different directions can be decoupled from the two further directions of the three different directions.

In a further embodiment of the invention, the third adjustment element includes a third fastening element, and a change of position and/or a distance between the at least one guide rail and the at least one guide element is able to be set by the third fastening element. This makes possible an especially exact adjustment of the change of position and/or of the distance between the at least one guide rail and the at least one guide element along the direction of the longitudinal extent of the at least one guide rail and/or of the at least one guide element. In addition, the change of position and/or of the distance between the at least one guide rail and the at least one guide element can be set easily, for example by turning the third fastening element.

In this context, the aforementioned distance is to be understood as the distance from an end area of the at least one guide rail to an end area of the at least one guide element. The third fastening element can be formed by any fastening element appearing reasonable to those skilled in the art. Especially advantageously, however, the third fastening element is formed by an adjustment screw, by which a position of the third adjustment element, especially of the at least one guide element, can be set in relation to the first adjustment element and/or in relation to the second adjustment element and/or in relation to the base plate. The third fastening element can be a self-locking adjusting screw, or a screw restrained by a corresponding subassembly, so that an undesired loosening of the third fastening element, especially of the adjusting screw, can be prevented.

A structurally simple change of position of the third adjustment element, and thus of the receiving component, can be achieved when the third adjustment element is arranged on the second adjustment element and a positioning of the third adjustment element in the direction of the longitudinal extent of the second fastening element is undertaken on the basis of the positioning of the second adjustment element in the direction of the longitudinal extent of the second fastening element.

In a further embodiment of the invention, the second adjustment element has at least one anti-rotation element and the third adjustment element has at least one anti-rotation element corresponding to the at least one anti-rotation element of the second adjustment element. This embodiment of the invention achieves a simple adjustment of a position of the receiving component without a change of position and/or movement along and/or in the direction of a first direction, especially along a spatial direction during this process having effects on a change of position and/or movement along and/or in the direction of a second direction. The position settings in the different spatial directions can thus be made independently of one another. In this context an anti-rotation element is to be understood as an element that prevents and/or blocks a rotation of the third adjustment element in relation to the second adjustment element. Furthermore a corresponding anti-rotation element is to be understood here as an anti-rotation element that is designed, in collaboration with the anti-rotation element of the second adjustment element, to prevent and/or to block a rotation of the third adjustment element in relation to the second adjustment element.

In a further embodiment of the invention, the second adjustment element and/or the third adjustment element is arranged on the first adjustment element and a position of the second adjustment element and/or of the third adjustment element in the direction of the longitudinal extent of the slot of the base plate is set on the basis of the positioning of the first adjustment element in the direction of the longitudinal extent of the slot of the base plate. This enables a structurally simple change of position of the second adjustment element and/or of the third adjustment element and thus of the receiving component to be made in the direction of the longitudinal extent of the slot, without the second adjustment element and/or the third adjustment element and/or the receiving component having to be moved directly in the process.

In a further embodiment of the invention, the third adjustment element is arranged between the first adjustment element and the second adjustment element, by which an especially compact adjustment unit for fastening the at least one housing shell to the subassembly can be achieved. Preferably the third adjustment element is clamped by the first fastening component, especially by the fastening screw thereof, between the first adjustment element and the second adjustment element.

If the second adjustment element and/or the third adjustment element is arranged between the first adjustment element and the base plate, an especially compact adjustment unit for fastening the at least one housing shell to the subassembly is achieved. In addition an especially simple securing of the second adjustment element and/or of the third adjustment element by the first fastening element is achieved.

In a further embodiment of the invention, the receiving component has at least one elastic securing element. This achieves vibration decoupling and/or oscillation decoupling between the subassembly, for example a basic field magnet of a magnetic resonance apparatus, and the at least one housing shell, so that transmission of vibrations and/or of sound waves to the at least one housing shell can be reduced and/or prevented. The elastic securing element can be arranged between a receiving element for directly receiving a fastening element of the at least one housing shell and the rest of the fastening component, especially of the receiving component. Here the receiving element can be arranged and/or supported oscillation-decoupled and/or vibration-decoupled on the at least one elastic securing element. The at least one elastic securing element preferably is composed of a sylomer material and/or a sylodyn material.

Preferably the receiving component has a cover plate with a receiving opening therein. This achieves an advantageous covering and thus an advantageous protection of the receiving component. In addition the at least one elastic securing element can be pre-tensioned within the receiving component by the cover plate, so that the at least one elastic securing element is constantly in an elastic operating point. This brings about an additional reduction of a transmission of undesired vibrations and/or sound waves and/or oscillations from the subassembly to the at least one housing shell. Preferably the cover plate is screwed to the receiving component, so that an optimal pre-tensioning can be set for the at least one elastic securing element.

In a further embodiment of the invention, the receiving component has a receiving tray with a receiving opening therein, and an opening surface of the receiving opening extends transversely to the direction of the longitudinal extent of the second fastening element. Preferably the opening surface is aligned essentially at right angles to the primary extent surface of the base plate and/or essentially at right angles to the primary extent surface of the first adjustment element and/or essentially at right angles to the primary extent surface of the second adjustment element and/or essentially at right angles to the primary extent surface of the third adjustment element. Preferably the fastening component is arranged on the subassembly such that the opening surface is on a side of the receiving component opposite to the direction of a weight force acting on the fastening component, so that the at least one housing shell, especially the fastening element of the at least one housing shell, can be suspended in the receiving tray. This achieves a simple and rapid installation and/or arrangement of the at least one housing shell on the subassembly by the fastening component.

In a further embodiment of the invention, the receiving component has a receiving pin with a longitudinal extent that is aligned parallel to the direction of the longitudinal extent of the third fastening element. This achieves a simple and rapid installation and/or arrangement of the at least one housing shell on the subassembly by the fastening component. In particular a connection and/or fastening to at least one fastening element corresponding to the receiving pin of the at least one housing shell can be made by the receiving pin.

Furthermore the at least one fastening component can be on a side of the subassembly facing toward the housing shell. This produces an arrangement and/or fastening of the at least one housing shell in which the at least one fastening component is at a short distance from the center of gravity of the at least one housing shell. In this case a lever arm acting between the fastening component and the housing shell can be minimized. In addition this enables tolerances, especially production tolerances, of individual components of the subassembly for a fastening and/or arrangement of the at least one housing shell on the subassembly by the arrangement of the fastening component on the side of the subassembly facing toward the housing shell to be compensated for. By contrast, with previous systems, in which the fastening component is arranged on a side of the subassembly that is essentially aligned at right angles to the side facing toward the housing shell, movements, especially compensation movements, must first be transformed, so that a positioning of the housing shell is especially complex and error-prone.

A further embodiment of the invention, the housing has three fastening elements for fastening of a housing shell. This enables an especially low-cost and subassembly-saving housing to be provided. Basically the housing shell can also be fastened to and/or arranged on the subassembly by more than three fastening elements. The number of fastening components is preferably matched to the size and/or weight of the at least one housing shell.

The inventive housing can be used for multiple subassemblies to be housed. Especially advantageously, however, the housing is suitable for housing a magnetic resonance apparatus, since here the reduction and/or suppression of transmission of oscillations and/or vibrations, especially of sound waves, while at the same time compensating for system tolerances, is especially advantageous. In an embodiment and/or design of the systems with a magnetic resonance apparatus, the subassembly preferably is a magnet unit of the magnetic resonance apparatus.

DESCRIPTION OF THE PREFERRED EMBODIMENTS

Figure 1:
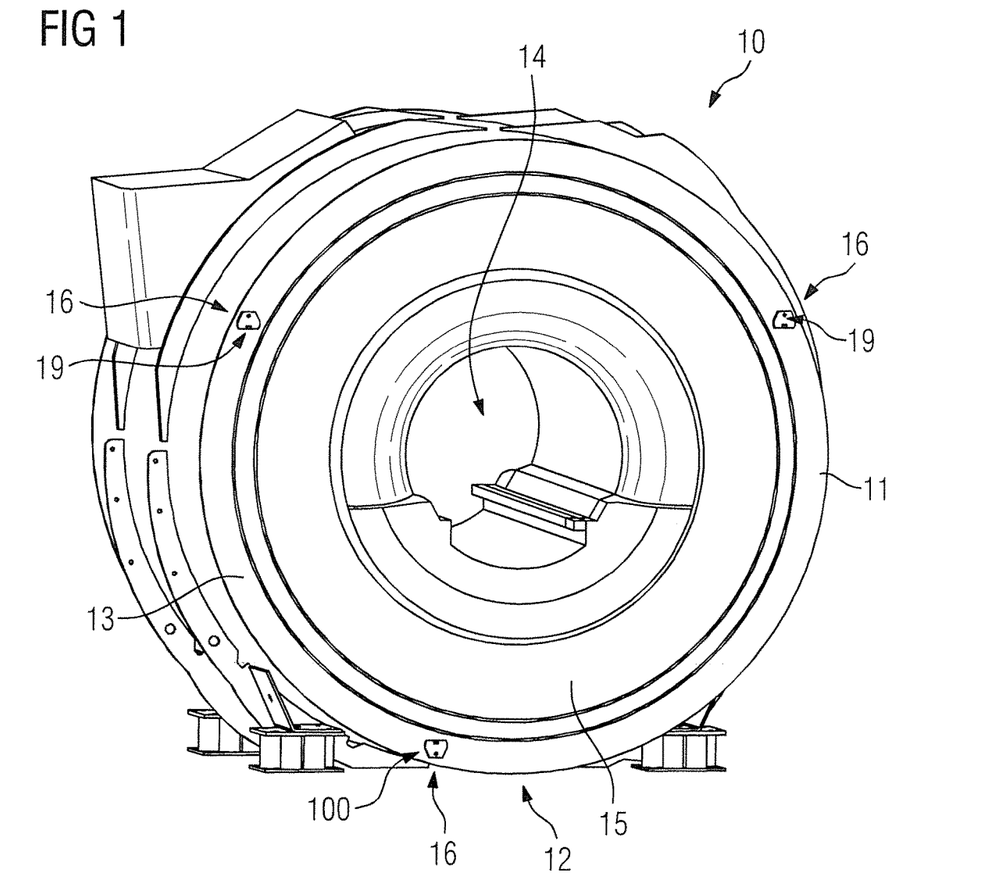
FIG. 1 shows an inventive magnetic resonance system with a housing, in a schematic illustration.

FIG. 1 shows a schematic diagram of an inventive system 10 with a subassembly 11. In this exemplary embodiment the system 10 is formed by a magnetic resonance apparatus 12, and the present invention is explained using the magnetic resonance apparatus 12 as an example. However the present invention is not restricted to the embodiment of the system 10 on a magnetic resonance apparatus 12 and further embodiments of the system 10 are readily conceivable.

The magnetic resonance apparatus 12 has a subassembly 11 formed by a magnet unit 13. The magnet unit 13 has a superconducting main magnet. The superconducting main magnet has a superconducting main magnet coil (not shown) or a number of superconducting main magnets for creating a strong and constant main magnetic field. The magnet unit 13 has a cylindrical shape or a barrel shape and has a cylindrical receiving area 14 inside it for receiving gradient coil units and radio-frequency antenna units, etc. Furthermore the receiving area is intended for receiving a patient during a magnetic resonance examination. For operation of the magnetic resonance apparatus 12, it is necessary for the superconducting main magnet coil or the number of superconducting main magnet coils to be cooled to a temperature of approx. −269° C. with a cooling fluid formed by liquid helium. For this purpose the superconducting main magnet is arranged within a vacuum vessel of the magnet unit 13.

The magnet unit 13 further has a magnet housing 15, which is arranged around the superconducting main magnet and around the vacuum vessel. The magnet housing 15 is likewise arranged in the shape of a cylinder or barrel around the superconducting main magnets and around the vacuum vessel, and also has a cylindrical receiving area 14 inside it (FIG. 1).

Figure 2:
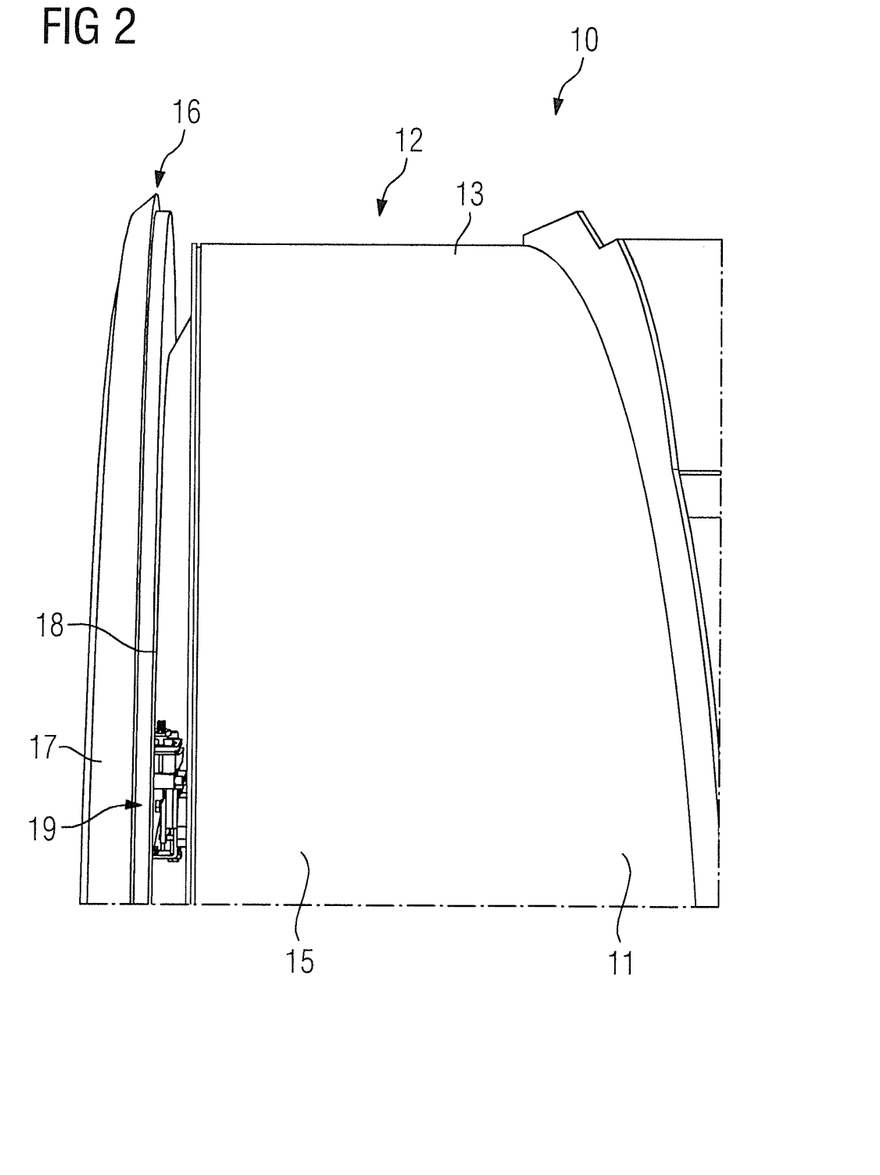
FIG. 2 shows a detailed view of the inventive housing on the magnetic resonance apparatus.

FIG. 2 shows a section of the magnet unit 13 with a housing 16 arranged on the magnet unit 13, more specifically the housing 16 arranged on the magnet housing 15. The housing 16 has a housing shell 17 for cladding a front side 18 of the magnet unit 13, especially the front side 18 of the magnet housing 15, and a number of fastening components 19, 100, wherein in FIG. 2 only one fastening component 19 can be seen. In addition the housing 16 has further housing shells, but the further housing shells have not been shown in FIG. 2, for clarity. For an arrangement of the housing shell 17 on the front side 18 of the magnet unit 13, especially on the front side 18 of the magnet housing 15, the housing 16 has three fastening components 19, 100, as is shown in FIG. 1. In the exemplary embodiment, two types of fastening components 19, 100 are used, as is explained in detail below. The individual fastening components 19, 100 are arranged on a side of the subassembly 11 facing toward the housing shell 17, especially the front side 18 of the magnet unit 13.

FIGS. 1 and 2 show the housing 16 for cladding the front side 18 of the magnet unit 13, especially the front side 18 of the magnet housing 15, in greater detail. In the same way there is an arrangement (not shown) of a housing shell on a rear side of the magnet unit 13, so that three fastening components 19, 100 of the housing 16 are also arranged on the rear side on the magnet unit 13. In an alternate embodiment of the invention, the housing 16 can have more than three fastening components 19, 100. The number of fastening components 19, 100 is preferably matched to the size and/or weight of the housing shell 17.

A first exemplary embodiment of an inventive fastening component 19 for fastening the housing shell 17 is shown in FIGS. 3 through 6. The fastening component 19 has a receiving component 20 and an adjustment component 21. The receiving component 20 is intended to receive a fastening element of the housing shell 17 (not shown). The receiving component 20 is arranged and/or supported on the fastening component 19 so that it can be moved in three different spatial directions 22, 23, 24 by the adjustment component 21. The adjustment component 21 is designed to define a position of the receiving component 20 in three different spatial directions 22, 23, 24 for fastening of the housing shell 17, so that the receiving component 20 has an optimal position for receiving the fastening element of the housing shell 17 for fastening of the housing shell 17 to the magnet unit 13.

Figure 4:
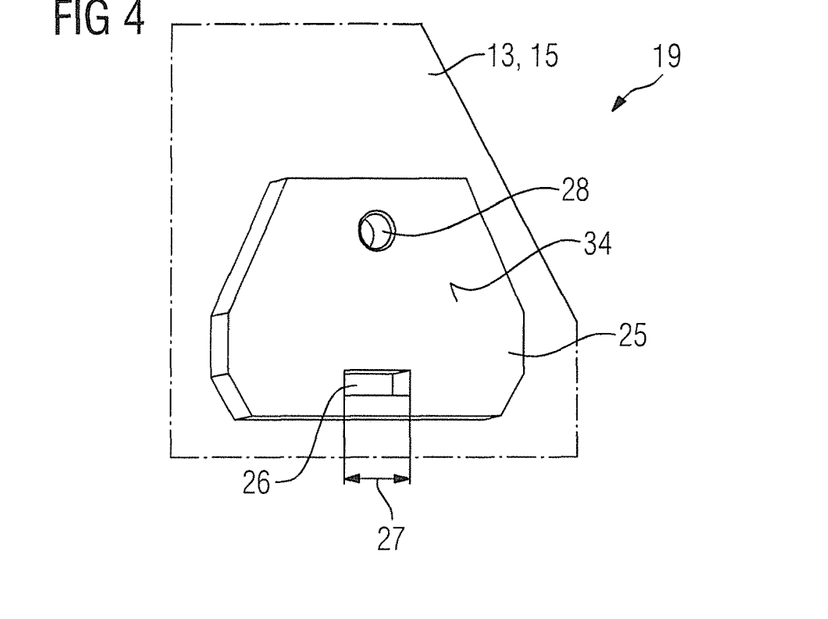
FIG. 4 shows a base plate of the first embodiment of the fastening component in a detailed view.

In addition, for arrangement of the fastening component 19 on the magnet unit 13, the fastening component 19 has a base plate 25 that is shown in detail in FIG. 4. The base plate 25 is welded to the magnet unit 13, namely the magnet housing 15, and is thus fixed to the magnet unit 13. The base plate 25 has a guide in the form of a cutout that is formed by a slot 26. The longitudinal extent 27 of the slot 26 runs essentially parallel to an edge of the base plate 25. Furthermore the base plate 25 has a further circular cutout 28 with an inner thread. The base plate 25 in this case is arranged on the magnet unit 13 such that the longitudinal extent 24 of the slot 26 is transverse or parallel to the weight force acting on the base plate 25.

Figure 3:
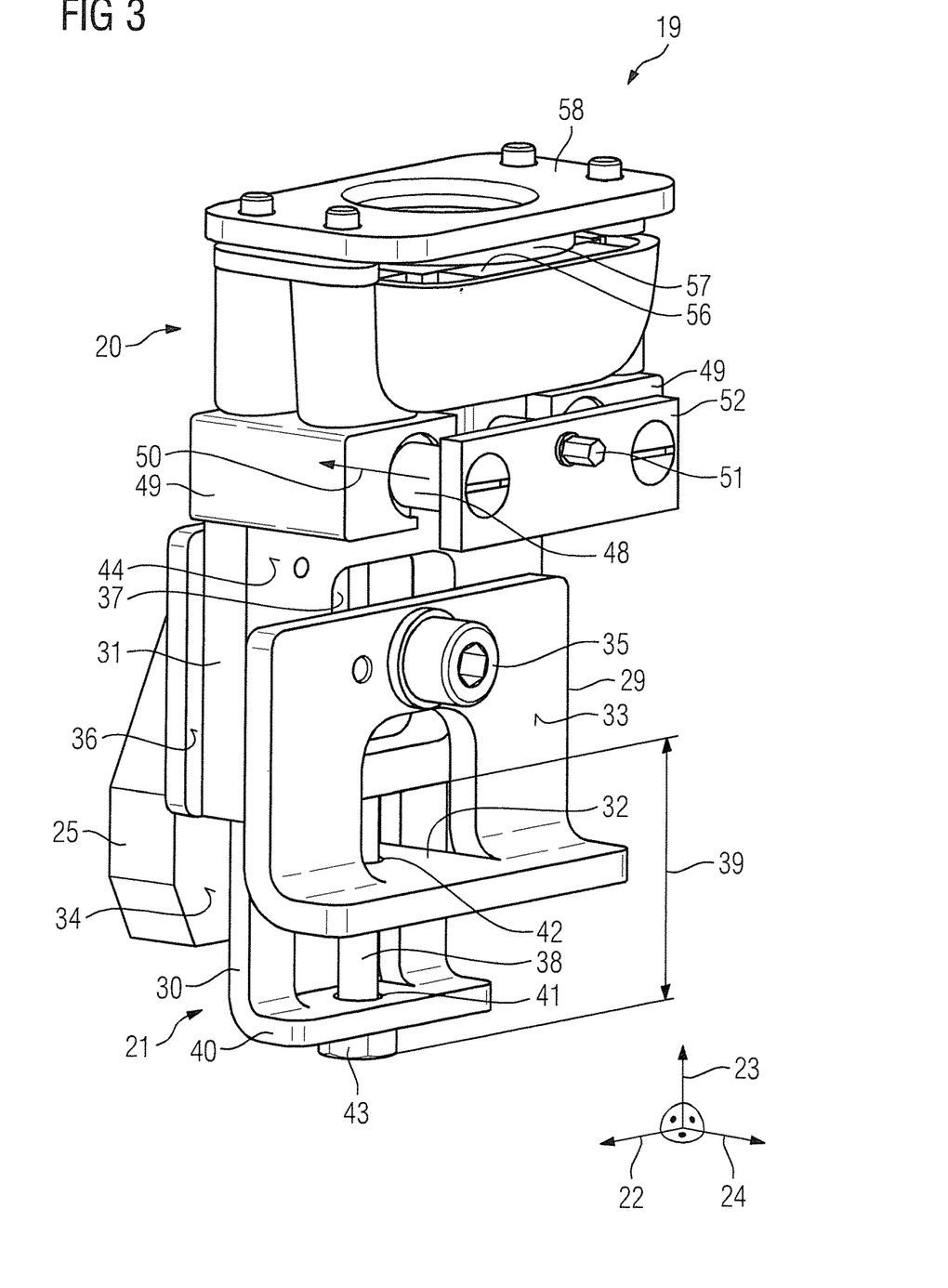
FIG. 3 shows a detailed view of a first embodiment of the fastening component.

The adjustment component 21 has a first adjustment element 29, a second adjustment element 30 and a third adjustment element 31 (FIG. 3). The first adjustment element 29 is designed in the form of a plate and has a web 32. The web 32 extends at right angles to a primary extent surface 33 of the first adjustment element 29, away from that surface. An end of the web 32 of the plate-type adjustment element 29 extending away from it engages into the slot 26 of the base plate 25 and secures a position of the first adjustment element 29 on the base plate 25. Through this the first adjustment element 29 is also arranged on the base plate in a torsion-proof manner. A position of the first adjustment element 29 on the base plate 25 is adjustable by means of an adjustment of a position of the webs 32 in the direction of the longitudinal extent 27 of the slot 26. The longitudinal extent 27 of the slot 26 here is parallel to a first spatial direction 22 of the three different spatial directions 22, 23, 24. The primary extent surface 33 of the plate-type first adjustment element 29 is aligned parallel to the primary extent surface 34 of the base plate 25.

Furthermore the adjustment component 21 has a first fastening element 35, by which the position of the first adjustment element 29 is able to be fixed in relation to the base plate 25. The first fastening element 35 has a screw, preferably a self-locking screw, so that an undesired loosening of the first fastening element 35 can be prevented. The first fastening element 35, for fixing and/or fastening of the first adjustment element 29 to the base plate 25, makes a connection with a circular cutout 28 of the base plate 25 (FIG. 3).

Optionally, a rubber ring can be arranged around the first fastening element 35. For example such a rubber ring can be arranged between the second adjustment element and the base plate 25 around the first fastening element 35.

The second adjustment element 30 is likewise designed in a plate shape. The primary extent surface 36 of the second adjustment element 30 in this case is aligned parallel to the primary extent surface 33 of the first adjustment element 29 and/or parallel to the primary extent surface 34 of the base plate 25. The second adjustment element 30 is arranged between the base plate 25 and the first adjustment element 29. To this end the second adjustment element 30 has a slot 37 with a longitudinal extent, wherein the longitudinal extent of the slot 36 of the second adjustment element 30 is aligned at right angles to the longitudinal extent 27 of the slot 26 of the base plate 25, and at right angles to a longitudinal extent of the first fastening element 35. The position of the second adjustment element 30 in relation to the base plate 25 and/or in relation to the first adjustment element 29 can be defined by the slot 37 of the second adjustment element 30. The first fastening element 35 is guided in the slot 37 of the second adjustment element 30 (FIG. 3).

The adjustment component 21 has a second fastening element 38. The second fastening element 38 has a screw, preferably an adjusting screw. The second fastening element 38 can also be a self-locking screw, especially a self-locking adjusting screw. The position of the second adjustment element 30 in the direction of a longitudinal extent 39 of the second fastening element 38 in relation to the first adjustment element 29 can be set by the second fastening element 38. The direction of the longitudinal extent 39 of the second fastening element 38 is essentially aligned at right angles to the direction of the longitudinal extent 27 of the slot 26 of the base plate 25. The longitudinal extent 39 of the second fastening element 38 is parallel to a second spatial direction 23 of the three different spatial directions 22, 23, 24.

To support the second fastening element 38 on the second adjustment element 30, the second adjustment element 30 is designed in an L-shape and has a web 40 on an end area. This web 40 of the second adjustment element 30 extends essentially transverse to the main extent surface 36 of the second adjustment element 30 away from the surface and has a guide 41 in the form of a cylindrical cutout, in which the second fastening element 38, especially the adjusting screw, is supported. The guide 41 can also have collar bushing as a plastic slide bearing. Furthermore the web 32 of the first adjustment element 29 also has a guide in the form of a cylindrical cutout 42 with an inner thread, in which the second fastening element 38, especially the adjusting screw, is movably supported and secured. The second adjustment element 30, especially the cylindrical cutout of the second adjustment element 30, is arranged in the direction of the longitudinal extent 39 of the second fastening element 38 between a screw head 43 of the second fastening element 38 and of the cylindrical cutout 42 of the first adjustment element 29. In this case the second adjustment element 30 is supported on the screw head 43, so that the position of the second adjustment element 30 in the direction of the longitudinal extent 39 of the second fastening element 38 can be set by changing the distance between the screw head 43 and the web 32 of the first adjustment unit 29 (FIG. 3).

The second adjustment element 30 is arranged by the second fastening element 38 on the first adjustment element 29, so that a change of position of the first adjustment element 29 in the direction of the longitudinal extent 27 of the slot 26 of the base plate 25 also brings about a change of position of the second adjustment element 30 in the direction of the longitudinal extent 27 of the slot 26 of the base plate 25.

Figure 5:
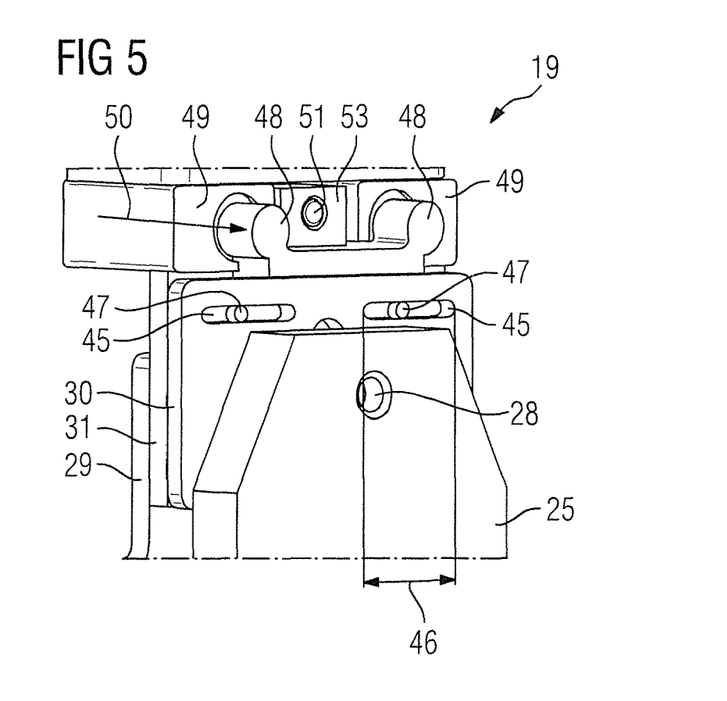
FIG. 5 shows a rear view of the first embodiment of the fastening component with arrangement of a third adjustment element on a second adjustment element, in a schematic illustration.

The receiving component 20 is arranged on the third adjustment element 31. The third adjustment element 31 is likewise designed in a plate shape and has a primary extent surface 44, which is parallel to the primary extent surface 34 of the base plate 25 and/or parallel to the primary extent surface 33 of the first adjustment element 29 and/or parallel to the primary extent surface 36 of the second adjustment element 30. The third adjustment element 31 is arranged between the second adjustment element 30 and the first adjustment element 29. The third adjustment element 31 is supported or arranged on the second adjustment element 30. To this end the second adjustment element 30 has two anti-rotation elements 45, each of which is formed as a slot, as can be seen in FIG. 5. The two anti-rotation elements 45 (the two slots) are arranged in the direction of a longitudinal extent 46 of the slots one after another and/or in series on the second adjustment element 30. The direction of the longitudinal extent 46 of the two slots of the second adjustment element 30 is parallel to the direction of the longitudinal extent 27 of the slot 26 of the base plate 25 and thus parallel to the first spatial direction 22 of the three different spatial directions 22, 23, 24. The third adjustment element 31 likewise has two anti-rotation elements 47, which are designed corresponding to the two anti-rotation elements 45 of the second adjustment element 30. In the present exemplary embodiment the two anti-rotation elements 47 of the third adjustment element 31 are pins that extend away from the plate-shaped third adjustment element 31. The anti-rotation elements 47 of the third adjustment element 31 engage in the anti-rotation elements 45 of the second adjustment element 30. In addition the third adjustment element 31 can be positioned in the direction of the longitudinal extent 46 of the slots of the second adjustment element 30 in relation to the second adjustment element 30 (FIG. 5).

As a result of the arrangement of the third adjustment element 31 on the second adjustment element 30, the third adjustment element 31 is positioned in the direction of the longitudinal extent 39 of the second fastening element 38 on the basis of the positioning of the second adjustment element 30 in the direction of the longitudinal extent 39 of the second fastening element 38. In addition, as a result of the arrangement of the third adjustment element 31 on the second adjustment element 30, the third adjustment element 31 is also moved and/or positioned together with the second adjustment element 30 for a positioning of the first adjustment element 29 in the direction of the longitudinal extent 27 of the slot 26 of the base plate 25.

The third adjustment element 31 has two guide rails 48 in an end area of the third adjustment element 31, which are arranged fixed on the third adjustment element 31 (FIGS. 3 and 5). The two guide rails 48 are aligned parallel to one another. The two guide rails 48 are designed in a cylindrical shape. Furthermore the third adjustment element 31 has two guide elements 49 corresponding to the two guide rails 48, which are arranged movably in relation to the two guide rails 48 on the third adjustment element 31. The two guide elements 49 corresponding to the two guide rails 48 each is a cylindrical cutout, in which one of the two guide rails 48 is respectively movably supported. Movement of one of the two guide rails 48, in each case, in one of the two guide elements 49, corresponding to the two guide rails 48 in each case, occurs in the direction 50 of the longitudinal extent of the guide rails 48 and/or in a direction 50 of the longitudinal extent of the guide elements 49.

The direction 50 of the longitudinal extent of the two guide rails 48 and/or the two guide elements 49 corresponding to the two guide rails 48 is aligned at right angles to the direction of the longitudinal extent 27 of the slot 26 of the base plate 25 and/or at right angles to the direction of the longitudinal extent 39 of the second fastening element 28. The direction 50 of the longitudinal extent of the two guide rails 48 and/or of the two guide elements 49 here is parallel to a direction of a longitudinal extent of the webs 32 of the first adjustment element 29. The direction 50 of the longitudinal extent of the two guide rails 48 and/or of the two guide elements 49 is parallel to a third spatial direction 24 of the three different spatial directions 22, 23, 24.

The receiving component 20 is arranged on the guide elements 49 so as to be movable in relation to the two guide rails 48. In the present exemplary embodiment, the receiving component 20 is firmly screwed to the guide elements 49 corresponding to the two guide rails 48. An alternate arrangement of the receiving component 20 on the guide elements 49 corresponding to the two guide rails 48 is readily conceivable.

The receiving component 20 is arranged on the end area of the adjustment component 21 facing away from the second fastening element 38. As a result of the fixed arrangement of the receiving component 20 on the third adjustment element 31, namely on the two guide elements 49 of the third adjustment element 31, the receiving component 20 carries out all movements that the third adjustment element 31 carries out. Thus the receiving component 20 carries out a movement in the direction of the longitudinal extent 39 of the second fastening element 38 as a result of the arrangement of the third adjustment element 31 on the second adjustment element 30, provided the second adjustment element 30 is moved in the direction of the longitudinal extent 39 of the second fastening element 38. Furthermore the receiving component 20 carries out a movement in the direction of the longitudinal extent 27 of the slot 26 of the base plate 25 as a result of the indirect arrangement of the third adjustment element 31 on the first adjustment element 29, provided the first adjustment element 29 is moved in the direction of the longitudinal extent 27 of the slot 26 of the base plate 25. The movement in the direction of the longitudinal extent 46 of the slots of the second adjustment element 30 is also carried out by the receiving component 20 as a result of its arrangement on the third adjustment element 31.

The third adjustment element 31 has a third fastening element 51 (FIG. 3). In the present exemplary embodiment the third fastening element 51 comprises a screw, especially an adjusting screw with preferably a trapezoidal thread. The third fastening element 51 can be a self-locking screw, especially a self-locking adjusting screw. By the trapezoidal thread, despite an effect of a weight force, a position of the housing shell can be set in the direction 50 of the longitudinal extent of the two guide rails 48.

A change of position and/or a distance between the two guide rails 48 and the two guide elements 49 is able to be set by means of the third fastening element 51. To this end the third adjustment element 31 has retaining plate 52, which is arranged on the end areas of the two guide rails 48 facing away from the two guide elements 49. In the present exemplary embodiment the retaining plate 52 is screwed to the end areas of the two guide rails 48. The direction 50 of the longitudinal extent of the guide rails 48 here is parallel to a surface normal of the main extent surface of the retaining plate 52. The retaining plate 52 has a cylindrical cutout with a circular cross section, in which the third fastening element 51 is arranged and/or supported. In addition a slip washer not shown in any greater detail can be arranged between the retaining plate 52 and the third fastening element 51. By means of the retaining plate 52 the third fastening element 51, especially a screw head, for example in the form of a hexagon head, etc., of the third fastening element 51, is supported in the direction 50 of the longitudinal extent of the guide rails 48.

In addition the third adjustment element 31 has a further cylindrical cutout 53 for guidance of the third fastening element 51 and/or as a counter bearing to the third fastening element (FIG. 5). The further cutout 53 can additionally include collar bushing for receiving the third fastening element 51. The further cutout 53 is arranged in an area of the third adjustment element 31, wherein the area between the two guide rails 48 is arranged in an area facing towards and end area of the two guide rails 48. In addition, the area is arranged in the direction 50 of the longitudinal extent of the guide rails 48 in an area of the third adjustment element 31 facing away from the retaining plate 52. Between the retaining plate 52 and the further cylindrical cutout 53 the third fastening element 51 is supported in a cutout with internal thread of the receiving component 20 (FIG. 3). By turning the third fastening element 51, the third fastening element 51 is screwed into or out of the cutout of the receiving component 20 and in this way a position of the receiving component 20 in relation to the second adjustment element 30 and/or of the first adjustment element 29 and/or of the base plate 25 is changed and/or varied.

Figure 6:
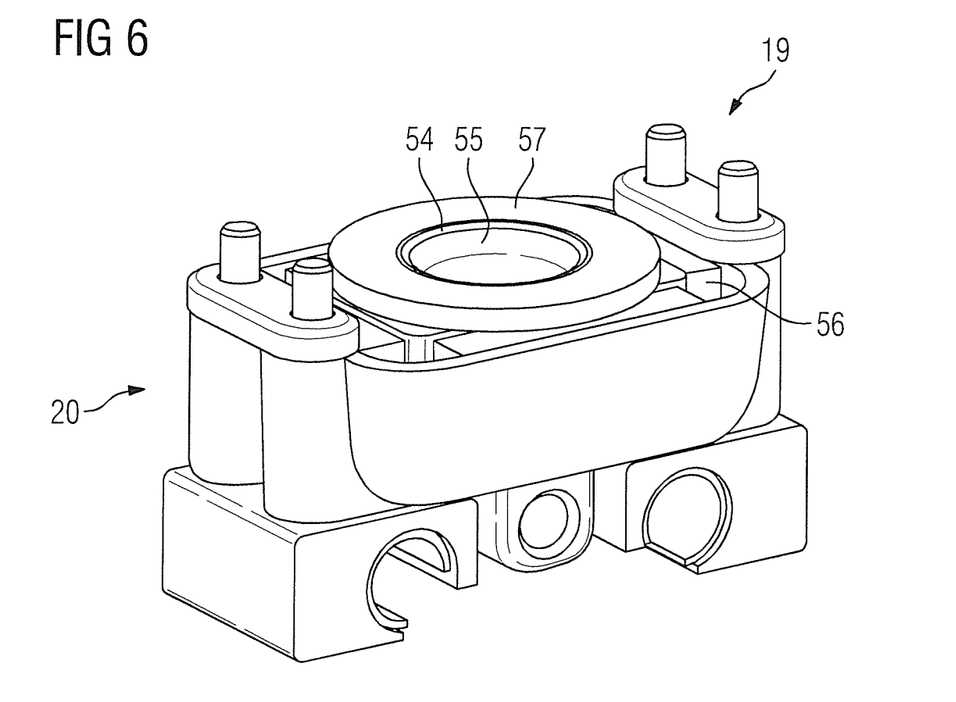
FIG. 6 shows a schematic internal view of a receiving component of the first embodiment of the fastening component.

In the present exemplary embodiment, the receiving component 20 also has a receiving tray 54, in which a fastening element of the housing shell 17 corresponding to the receiving tray 54 can be received and/or supported (FIGS. 3 and 6). The fastening element of the housing shell 17 corresponding to the receiving tray 54 can be, for example, a ball stud and/or further fastening elements appearing sensible to the person skilled in the art. To this end the fastening component 19 is arranged on the subassembly 11, especially the magnet unit 13, such that a receiving opening 55 of the receiving tray 54, particularly an opening surface of the receiving opening 55, is arranged on side of the receiving component 20 opposite to a direction of a weight force acting on the fastening component 19 (FIGS. 3 and 6). The opening surface of the receiving opening 55 here is arranged and/or aligned transverse to the direction of the longitudinal extent 39 of the second fastening element 38.

Furthermore the receiving component 20 has two elastic securing elements 56, 57. A first of the two elastic securing elements 56 surrounds the receiving tray 54 on an outer tray housing and in this way reduces a transmission of oscillations from the subassembly 11 to the housing shell 17. A second of the two elastic securing elements 57 is an elastic securing ring and is arranged around the receiving opening 55 of the receiving tray 54. The two elastic securing elements 56, 57 are preferably formed by a sylomer and/or a sylodyn. Transverse forces that can act on the receiving tray 54 can be reduced and thus an undesired twisting of the receiving component 20, especially of the receiving tray 54, can be prevented by means of the elastic securing ring.

The receiving component 20 also has a cover plate 58 with a receiving opening. The cover plate 58 is arranged on the receiving component 20 such that the receiving opening 58 of the cover plate is concentric to the receiving opening 55 of the receiving tray 54. The cover plate 58 covers the receiving component 20, wherein the elastic securing ring is arranged between a housing of the receiving tray 54 and the cover plate 58. With the cover plate 58 the two securing elements 56, 57 can be pre-tensioned within the receiving component 20, so that an optimal working point for oscillation decoupling and/or vibration decoupling is available.

Figure 7:
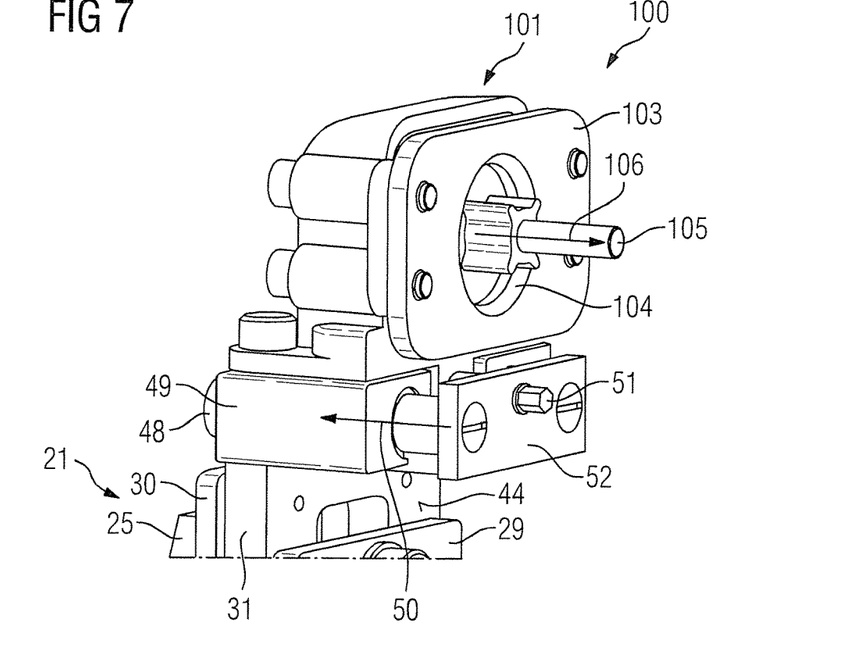
FIG. 7 shows a schematic detailed view of a section of a second embodiment of the fastening component with the receiving component.
Figure 8:
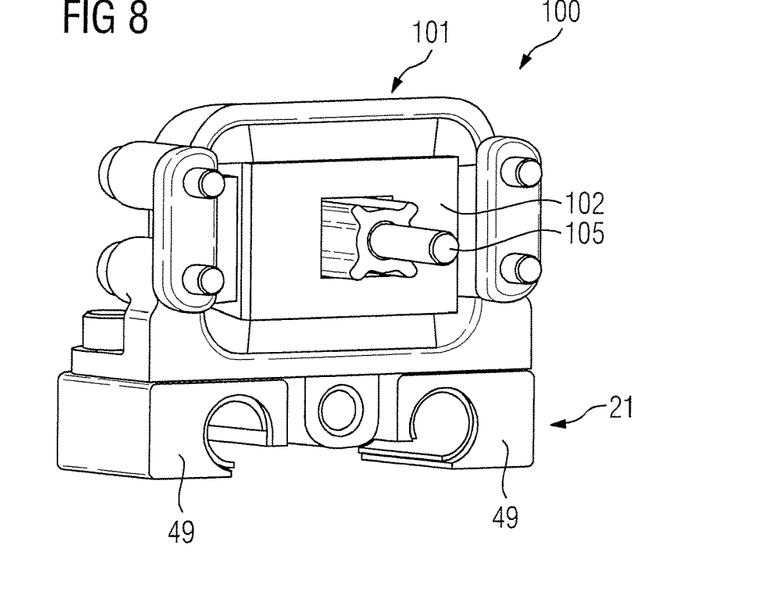
FIG. 8 shows a schematic internal view of a receiving component of the second embodiment of the fastening component.

An alternate exemplary embodiment of the inventive fastening component 100 is shown in FIGS. 7 and 8. Elements, features and functions that essentially remain the same are basically labeled with the same reference characters. The description given below is essentially restricted to the differences from the exemplary embodiment in FIGS. 3 to 6, wherein, in relation to elements, features and functions that remain the same, the reader is referred to the description of the exemplary embodiment in FIGS. 3 to 6.

The fastening component 100 in FIGS. 7 and 8 has an adjustment component 21 and a receiving component 101. The adjustment component 21 and a base plate 25 of the fastening component 100 are designed similarly to the description for FIGS. 2 through 6. The fastening component 100 differs from the fastening component 19 of FIGS. 3 through 6 in respect of the design of the receiving component 101.

The receiving component 101 likewise has an elastic securing element 102 and a cover plate 103 with a receiving opening 104. Furthermore the receiving component 101 has a receiving pin 105 with a longitudinal extent, wherein a direction 106 of the longitudinal extent of the receiving pin 105 is aligned in parallel to the direction of the longitudinal extent of the third fastening element 51. The receiving pin 105 is supported within the elastic securing element 102. The elastic securing element 102 is likewise preferably formed from a sylomer and/or a sylodyn.

The cover plate 103 is arranged on the receiving component 100 such that the receiving pin 105 projects through the receiving opening 104 of the cover plate 103. The cover plate 103 covers the receiving component 101, wherein the elastic securing element 102 is held in position by the cover plate 103. By the cover plate 103 the securing element 102 can be pre-tensioned within the receiving component 101, so that an optimal working point for oscillation decoupling and/or vibration decoupling is available.

The fastening component 100 of FIGS. 7 and 8 is preferably designed for receiving a fastening element of the housing shell 17, wherein the fastening element of the housing shell 17 can be a clip connector, a nut or a sheet metal spring clip.

For arrangement of the housing shell 17 the fastening component 19 shown in FIGS. 2 through 6 and the fastening component 100 shown in FIGS. 7 and 8 are used at the same time. Here two of the fastening components 19 shown in FIGS. 2 to 6 are arranged in an upper area of the subassembly 11, especially of the magnet unit 13, on the subassembly 11, especially the magnet unit 13. The individual fastening components 19 in this are arranged on the surface of the subassembly 11, especially of the magnet unit 13, in such a way that the receiving opening of the cover plate 58 is arranged on a side of the receiving component 20 opposite to a direction of a weight force acting on the fastening component 19. By means of the two fastening components 19 there is an evenly-distributed suspension of the housing shell 17.

The fastening component 100 shown in FIGS. 7 and 8 is arranged in a lower area of the subassembly 11, especially of the magnet unit 13. The fastening component 100 in this case is arranged on the surface of the subassembly 11, especially of the magnet unit 13, such that the direction 106 of the longitudinal extent of the receiving pins 105 is essentially at right angles to the weight force acting on the fastening component 100. In the present exemplary embodiment the housing 16 has a single fastening component 100, which is embodied according to FIGS. 7 and 8 and is arranged in the lower area of the subassembly 11, especially of the magnet unit 13. With the fastening component 100 there is an advantageous securing of the housing shell 17, so that the housing shell 17 is secured against an undesired falling out of the two fastening components 19. In addition an asymmetry of the housing shell 17 can be compensated for by the three fastening components 19, 100.

Although modifications and changes may be suggested by those skilled in the art, it is the intention of the inventors to embody within the patent warranted hereon all changes and modifications as reasonably and properly come within the scope of their contribution to the art.

We claim as our invention:

1. A system comprising:
   a subassembly;
   a housing surrounding said subassembly, said housing comprising at least one housing shell having a fastening element and at least one fastening component;
   said at least one fastening component comprising a receiving component that receives the fastening element of said housing shell, and an adjustment component, said receiving component being situated on the fastening component and being movable by said adjustment component in each of three spatial directions, each of the three spatial directions being orthogonal to one another, with said movement of said receiving component by said adjustment component in any one of the three spatial directions being independent of movement of said receiving component by said adjustment component in the other two of said three spatial directions;
   said at least one fastening component comprising a base plate fixed on said subassembly, said base plate comprising a slot, and a first adjustment element having a tab that extends at right angles to a primary extent surface of the first adjustment element to engage into the slot included in the base plate, with a position of said tab being adjustable in a direction of a longitudinal extent of said slot, and a first fastening element that fastens said first adjustment element to said base plate;
   said adjustment component further comprising a second adjustment element in a second fastening element, wherein in a position of the second adjustment element is adjustable by the second fastening element, the position of the second adjustment element being set in a direction of a longitudinal extent of the second fastening element, and wherein the direction of the longitudinal extent of the second fastening element is aligned at right angles to the direction of longitudinal extent of the slot of the base plate, said first adjustment element having a guide, and wherein the second fastening element is situated movably in the guide of the first adjustment element; and
   said adjustment component further comprising a third adjustment element on which said receiving component is situated.

2. A system as claimed in claim 1 wherein said third adjustment element has at least one guide rail that is fixed to the third adjustment element, and has at least one guide element corresponding to the at least one guide rail, said at least one guide element being movable in relation to said guide rail.

3. A system as claimed in claim 2 wherein said receiving component is situated on said at least one guide element corresponding to said at least one guide rail.

4. A system as claimed in claim 2 wherein at least one of said guide rail and said guide element has a longitudinal extent at right angles to the direction of longitudinal extent of the slot of the base plate.

5. A system as claimed in claim 2 wherein at least one of said guide rail and said guide element has a longitudinal extent at right angles to the direction of longitudinal extent of the second fastening element.

6. A system as claimed in claim 2 wherein said third adjustment element has a third fastening element, and wherein a change of position or distance between said at least one guide rail and said at least one guide element is set by said third fastening element.

7. A system as claimed in claim 6 wherein said third adjustment element is situated on said second adjustment element and wherein a position of the third adjustment element in the direction of longitudinal extent of said second fastening element is set dependent on positioning of said second adjustment element in the direction of the longitudinal extent of said second fastening element.

8. A system as claimed in claim 7 wherein said second adjustment element comprises at least one anti-rotation element, and said third adjustment element comprises at least one anti-rotation element corresponding to the at least one anti-rotation element of the second adjustment element.

9. A system as claimed in claim 6 wherein said receiving component has a receiving pin with a longitudinal extent, said longitudinal extent of said receiving pin being aligned parallel to the direction of longitudinal extent of said third fastening element.

10. A system as claimed in claim 1 wherein said third adjustment element is situated on said first adjustment element, and a position of the third adjustment element in the direction of the longitudinal extent of the slot of the base plate is set dependent on positioning of said first adjustment element in the direction of the longitudinal extent of the slot of the base plate.

11. A system as claimed in claim 10 wherein said third adjustment element is situated between the first adjustment element and the second adjustment element.

12. A system as claimed in claim 10 wherein said third adjustment element is situated between said first adjustment element and said base plate.

13. A system as claimed in claim 1 wherein said second adjustment element is situated on said first adjustment element, and a position of the second adjustment element is set dependent on positioning of the first adjustment element in the direction of the longitudinal extent of the slot of the base plate.

14. A system as claimed in claim 13 wherein said second adjustment element is situated between said first adjustment element and said base plate.

15. A system as claimed in claim 1 wherein said adjustment component comprises a second adjustment element in a second fastening element, wherein in a position of the second adjustment element is adjustable by the second fastening element, and wherein said receiving component comprises a receiving tray with a receiving opening therein, said receiving opening having an opening surface that extends transversely to the direction of longitudinal extent of said second fastening element.

16. A system as claimed in claim 1 wherein said receiving component comprises at least one elastic securing element.

17. A system as claimed in claim 1 wherein said receiving component comprises a cover plate having a receiving opening therein.

18. A system as claimed in claim 1 wherein said at least one fastening component is situated on a side of said subassembly facing toward said housing shell.

19. A system as claimed in claim 1 wherein said housing comprises at least three fastening components for fastening said housing shell.

20. A system as claimed in claim 1, wherein the longitudinal extent of said slot included in the base plate is parallel to an edge of the base plate and one of said three spatial directions.

21. A magnetic resonance apparatus comprising:

a magnetic resonance data acquisition scanner;

a housing surrounding said data acquisition scanner, said housing comprising at least one housing shell having a fastening element and at least one fastening component;

said at least one fastening component comprising a receiving component that receives the fastening element of said housing shell, and an adjustment component, said receiving component being situated on the fastening component and being movable by said adjustment component in each of three spatial directions, each of the three spatial directions being orthogonal to one another, with said movement of said receiving component by said adjustment component in any one of three spatial directions being independent of movement of said receiving component by said adjustment component in the other two of said three spatial directions;

said at least one fastening component comprising a base plate fixed on said subassembly, said base plate comprising a slot, and a first adjustment element having a tab that extends at right angles to a primary extent surface of the first adjustment element to engage into the slot included in the base plate, with a position of said tab being adjustable in a direction of a longitudinal extent of said slot, and a first fastening element that fastens said first adjustment element to said base plate;

said adjustment component further comprising a second adjustment element in a second fastening element, wherein in a position of the second adjustment element is adjustable by the second fastening element, the position of the second adjustment element being set in a direction of a longitudinal extent of the second fastening element, and wherein the direction of the longitudinal extent of the second fastening element is aligned at right angles to the direction of longitudinal extent of the slot of the base plate, said first adjustment element having a guide, and wherein the second fastening element is situated movably in the guide of the first adjustment element; and said adjustment component further comprising a third adjustment element on which said receiving component is situated.

\* \* \* \* \*